United States Patent
Abasov et al.

(10) Patent No.: US 8,332,195 B2
(45) Date of Patent: Dec. 11, 2012

(54) SYSTEMS AND METHODS FOR RUNNING A MULTI-THREAD SIMULATION

(75) Inventors: Shahin Abasov, Houston, TX (US); Ron Mossbarger, Houston, TX (US); Graham Fleming, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 1059 days.

(21) Appl. No.: 12/272,525

(22) Filed: Nov. 17, 2008

(65) Prior Publication Data

US 2010/0125443 A1    May 20, 2010

(51) Int. Cl.
*G06G 7/48* (2006.01)

(52) U.S. Cl. ............................................. 703/10; 703/6

(58) Field of Classification Search .................. 703/6, 10
See application file for complete search history.

(56) References Cited

U.S. PATENT DOCUMENTS

| | | | |
|---|---|---|---|
| 7,512,543 B2 * | 3/2009 | Raghuraman et al. | 705/7.28 |
| 7,546,228 B2 * | 6/2009 | Cullick et al. | 703/10 |
| 7,835,893 B2 * | 11/2010 | Cullick et al. | 703/6 |
| 2004/0220846 A1 * | 11/2004 | Cullick et al. | 705/8 |
| 2009/0119310 A1 * | 5/2009 | Larue et al. | 707/100 |

* cited by examiner

*Primary Examiner* — Mary C Jacob
*Assistant Examiner* — Aniss Chad
(74) *Attorney, Agent, or Firm* — Crain Caton & James; Bradley A. Misley

(57) ABSTRACT

Systems and methods for running a multi-thread simulation and evaluating the results during a simulation run to select the best thread.

18 Claims, 3 Drawing Sheets

SYSTEMS AND METHODS FOR RUNNING A MULTI-THREAD SIMULATION

CROSS-REFERENCE TO RELATED APPLICATIONS

Not applicable.

STATEMENT REGARDING FEDERALLY SPONSORED RESEARCH

Not applicable.

FIELD OF THE INVENTION

The present invention generally relates to running a multi-thread simulation to select the best thread. More particularly, the present invention relates to evaluating the results of a multi-thread simulation during a simulation run.

BACKGROUND OF THE INVENTION

In the oil and gas industry, there is often a requirement during reservoir simulation studies to look at the impact of certain parameters on the simulation performance and results. These parameters are studied through the submission of multiple jobs, which often require manual data manipulation by the engineer or the use of iterative 'decision management' environments. Iterative 'decision management' environments require the model be run from the beginning or from pre-defined 'restart' points created by previous runs. Decision management environments may be used, for example, to modify: (i) solver parameters; (ii) injection/production constraints; (iii) well configuration; (iv) well management; (v) network configuration; (vi) different start times for certain threads, and; (vii) completion sequences.

The current generation of reservoir simulators do not have the ability to simultaneously evaluate different alternative simulation scenarios during a simulation and then choose a scenario as the optimum path (best result) on which to continue. Each scenario represents a thread that is designated as a path the simulation could possibly take. Because of the inability to consider different threads, the user must either define all possible threads upfront and use special 'decision management' applications to manage this type of problem externally, or resort to the manual process of submitting multiple runs with manual data changes.

Therefore, there is a need to simultaneously evaluate different alternative simulation threads during a simulation run and select the best thread to continue the simulation run.

SUMMARY OF INVENTION

The present invention meets the above needs and overcomes one or more deficiencies in the prior art by providing systems and methods for evaluating multiple simulation threads during a simulation run.

In one embodiment, the present invention includes a computer implemented method for evaluating multiple simulation threads during a simulation run, comprising: i) setting a simulation checkpoint; ii) designating a number of multiple simulation threads; iii) designating a subjective parameter and an objective parameter; iv) designating a time to run a multi-thread simulation; v) starting the simulation run using a computer processor; vi) designating an additional subjective parameter based on one or more simulation conditions during the simulation run; vii) running the multi-thread simulation for the number of multiple simulation threads at the simulation checkpoint using the subjective parameter, the additional subjective parameter-and the time; and viii) evaluating a result for the multi-thread simulation using the objective parameter.

In another embodiment, the present invention includes a non-transitory program carrier device tangibly carrying computer executable instructions for evaluating multiple simulation threads during a simulation run. The instructions are executable to implement: i) setting a simulation checkpoint; ii) designating a number of multiple simulation threads; iii) designating a subjective parameter and an objective parameter; iv) designating a time to run a multi-thread simulation; v) starting the simulation run; vi) designating an additional subjective parameter based on one or more simulation conditions during the simulation run; vii) running the multi-thread simulation for the multiple simulation threads at the simulation check point using the subjective parameter, the additional subjective parameter and the time; and viii) evaluating a result for the multi-thread simulation using the objective parameter.

Additional aspects, advantages and embodiments of the invention will become apparent to those skilled in the art from the following description of the various embodiments and related drawings.

BRIEF DESCRIPTION OF THE DRAWINGS

The present invention is described below with references to the accompanying drawings in which like elements are referenced with like reference numerals, and in which.

DETAILED DESCRIPTION OF THE PREFERRED EMBODIMENTS

The subject matter of the present invention is described with specificity, however, the description itself is not intended to limit the scope of the invention. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order.

System Description

The present invention may be implemented through a computer-executable program of instructions, such as program modules, generally referred to as software applications or application programs executed by a computer. The software may include, for example, routines, programs, objects, components, and data structures that perform particular tasks or implement particular abstract data types. The software forms an interface to allow a computer to react according to a source of input. NEXUS™, which is a commercial software application marketed by Landmark Graphics Corporation, may be used as an interface application to implement the present invention. The software may also cooperate with other code segments to initiate a variety of tasks in response to data received in conjunction with the source of the received data. The software may be stored and/or carried on any variety of memory media such as CD-ROM, magnetic disk, bubble memory and semiconductor memory (e.g., various types of RAM or ROM). Furthermore, the software and its results may be transmitted over a variety of carrier media such as optical fiber, metallic wire, free space and/or through any of a variety of networks such as the Internet.

Moreover, those skilled in the art will appreciate that the invention may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof, in a computer system or other processing system.

Figure 1:
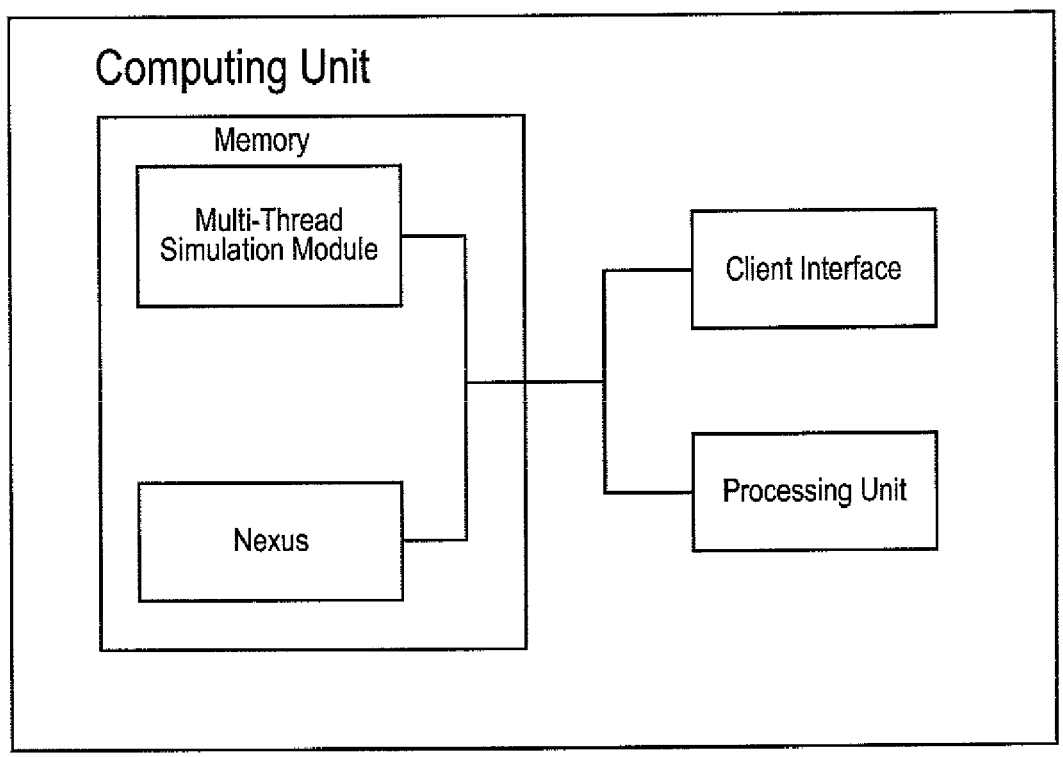
FIG. 1 is a block diagram illustrating a system for implementing the present invention.

Referring now to FIG. 1, a block diagram of a system for implementing the present invention on a computer is illustrated. The system includes a computing unit, sometimes referred to as a computing system, which contains memory, application programs, a client interface, and a processing unit. The computing unit is only one example of a suitable computing environment and is not intended to suggest any limitation as to the scope of use or functionality of the invention.

Figure 2:
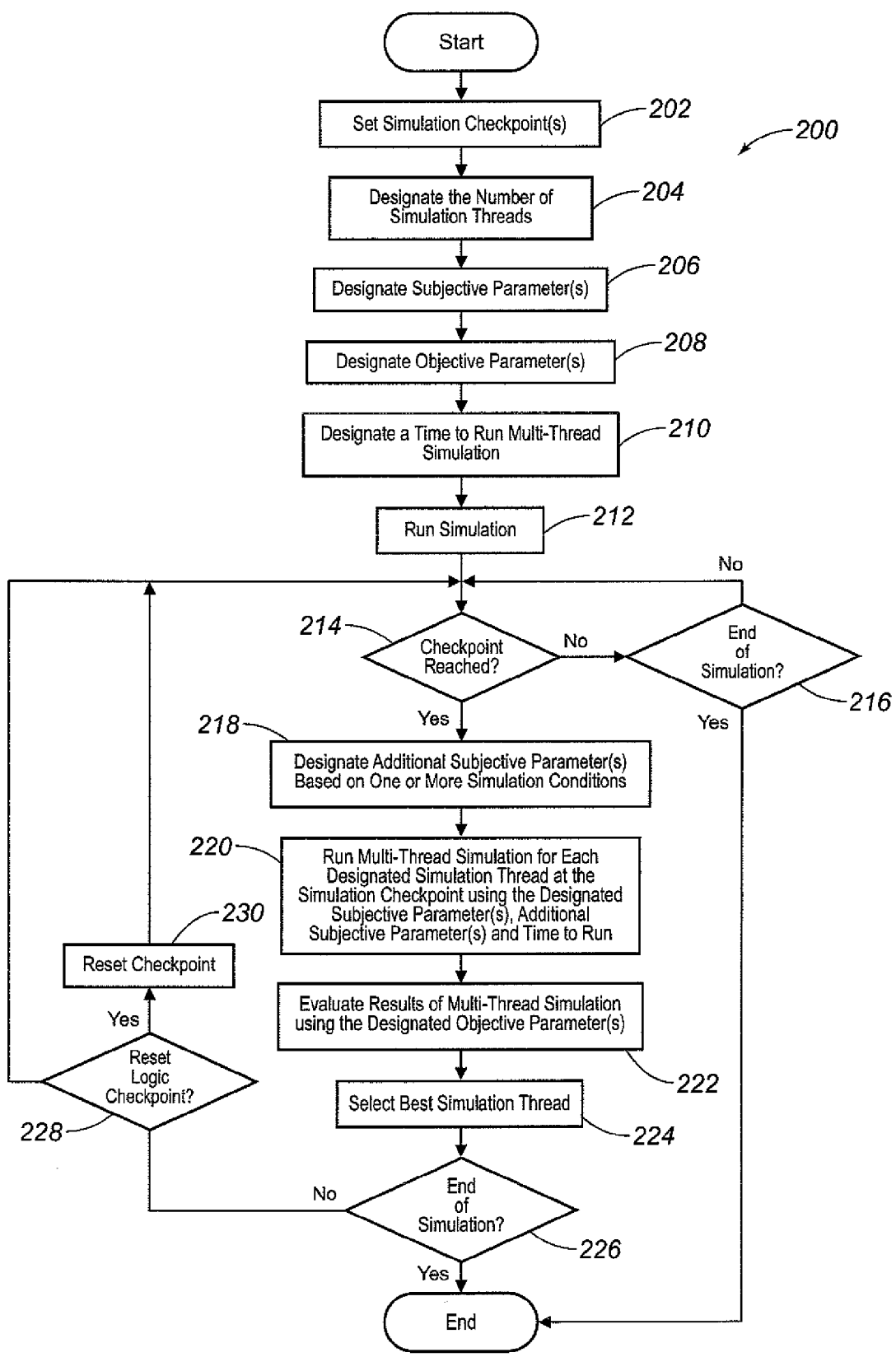
FIG. 2 is a flow diagram illustrating one embodiment of a method for implementing the present invention.
Figure 3:
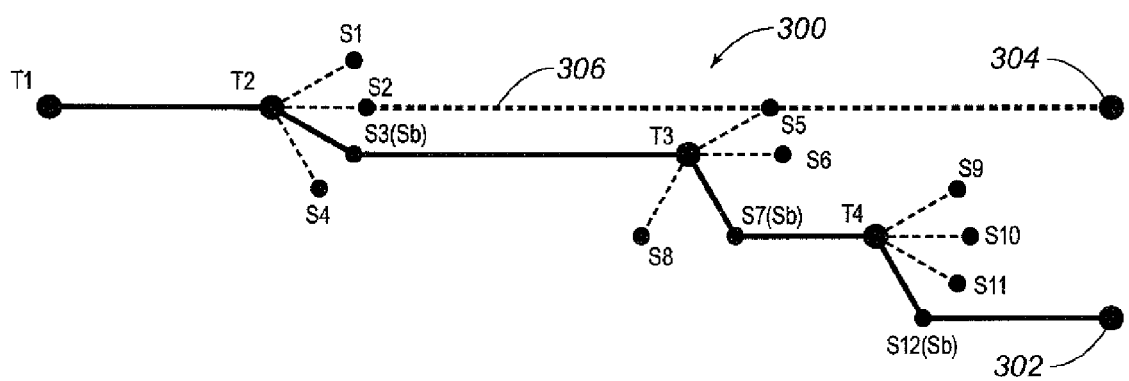
FIG. 3 is an exemplary simulation illustrating the method in FIG. 2.

The memory primarily stores the application programs, which may also be described as program modules containing computer-executable instructions, executed by the computing unit for implementing the methods described herein and illustrated in FIGS. 2-3. The memory therefore, includes a multi-thread simulation module, which enables the methods illustrated and described in reference to FIGS. 2-3, and NEXUS™.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/nonremovable, volatile/non-volatile computer storage media. For example only, a hard disk drive may read from or write to nonremovable, nonvolatile magnetic media, a magnetic disk drive may read from or write to a removable, non-volatile magnetic disk, and an optical disk drive may read from or write to a removable, nonvolatile optical disk such as a CD ROM or other optical media. Other removable/non-removable, volatile/non-volatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above therefore, store and/or carry computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like.

These and other input devices are often connected to the processing unit through the client interface that is coupled to a system bus, but may be connected by other interface and bus structures, such as a parallel port or a universal serial bus (USB). A monitor or other type of display device may be connected to the system bus via an interface, such as a video interface. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

Method Description

The present invention will allow the user to specify logic or time conditions that can be monitored during the course of a simulation run. When a condition is satisfied, it may be referred to as a checkpoint. At each checkpoint, the simulation of the base thread stops, makes changes to the simulation model input parameters, based on current simulation results, and generates new multi-thread simulations with modified input parameters to evaluate multiple scenarios. This multi-thread approach will increase the efficiency of the simulation process, reduce the number of full simulation runs, and can significantly decrease the cycle time required to complete reservoir studies. This approach can be used in many different types of modeling and is not limited to reservoir modeling.

Referring now to FIG. 2, one embodiment of a method 200 for implementing the present invention is illustrated.

The method 200 may be used to realize a prediction calculation for an oil reservoir. When using prediction calculations, requirements are set to maintain a certain level of production for a number of years. This calculation is necessary due to the fact that, over time, well production declines. When well production declines, a decision must be made to gather groups of wells together and convert them to gaslifts in order to maintain the required production level. The present invention therefore, may be used in this situation to simultaneously evaluate the performance of different well groups and select the best group to meet simulation requirements.

In step 202, one or more simulation checkpoints are set based on predetermined conditions related to the simulation objectives. The checkpoints consist of a logic condition and/or a time condition. A logic condition, for example, may be $Q\_Oil < 20000$ Standard Barrels ("STB")/day, which represents a condition to monitor if oil production is less than 20,000 standard barrels per day. If, during the simulation, this condition is satisfied, then a checkpoint is satisfied. The time conditions may be calculated from the simulation start point or from each respective checkpoint. Each checkpoint may therefore, represent the same time condition measured from a prior time condition or different time conditions. Furthermore, one or more checkpoints may be set at this step, comprising time conditions, logic conditions or a combination of both.

Referring now to FIG. 3, the exemplary simulation 300 includes a simulation start time T1 and multiple time conditions representing the checkpoints (T2, T3, T4).

In step 204, the number of simulation threads are designated. In the simulation 300, for example, there are four different simulation threads (S1, S2, S3, S4) at checkpoint T2. The number of simulation threads evaluated at each checkpoint (T2, T3, T4) may be the same during the simulation run. Although four (4) simulation threads are used in the simulation 300, any number of simulation threads may be designated depending upon the simulation objectives.

In step 206, one or more subjective parameters are designated. Parameters may include, for example, the maximum number of wells to switch to gas lift or that are switching to gas lift at a particular time during the simulation run. In other words, the subjective parameters may be used to group wells during a reservoir simulation run.

In step 208, one or more objective parameters are designated. Objective parameters may include, for example, a preferred or predetermined level of reservoir production.

In step 210, a time to run the multi-thread simulation is designated. The designated time to run a multi-thread simulation may be determined by the simulation objectives including, but not limited to, the designated objective parameters.

In step 212, run the simulation. As illustrated by the simulation 300 in FIG. 3, the simulation run begins at T1 and proceeds through to the first checkpoint T2 based upon default parameters for the simulation model.

In step 214, determine if a checkpoint has been reached. A checkpoint is reached when a specific time condition or logic condition is satisfied. If a checkpoint has been reached, then the method 200 continues to step 218. If a checkpoint has not been reached, then the method 200 continues to step 216.

In step 216, determine if the simulation ends. If the simulation ends, then the method 200 ends. If the simulation does not end, then the method 200 returns to step 214 and continues to run the simulation until another checkpoint is reached.

In step 218, one or more additional subjective parameters are designated based on one or more simulation conditions. Additional subjective parameters may be tailored to create, for example, a subset of wells identified by the designated subjective parameters in step 206.

In step 220, a multi-thread simulation is run for each designated simulation thread at the simulation checkpoint using the designated subjective parameters, additional subjective parameters and time to run. In the simulation 300, a multi-thread simulation is run for each designated simulation thread (S1, S2, S3, S4) at checkpoint T2 using the designated subjective parameters, additional subjective parameters and time to run. The multi-thread simulation is preferably run simultaneously for each designated simulation thread at the checkpoint.

In step 222, the results of the multi-thread simulation run in step 220 are evaluated using the designated objective parameters. The results of the multi-thread simulation are evaluated to determine the best simulation thread from the designated number of simulation threads.

In step 224, the best simulation thread is selected. As demonstrated by the simulation 300, the best simulation thread (Sb) at checkpoint T2 is simulation thread S3. The simulation continues from checkpoint T2 along simulation thread S3.

In step 226, determine if the simulation ends, using simulation thread S3 for example. If the simulation ends, then the method 200 ends. If the simulation does not end, then the method 200 continues to step 228.

In step 228, determine if a logic checkpoint should be reset. If a logic checkpoint does not need to be reset, then the method 200 returns to step 214 to continue the simulation until another checkpoint is reached. If a logic checkpoint should be reset, then the method 200 continues to step 230.

In step 230, a logic checkpoint is reset and the method continues to step 214. In this manner, the same logic checkpoint may be used as a checkpoint at multiple instances during the simulation run. Alternatively, multiple different logic checkpoints may be used during the simulation run without resetting each logic checkpoint, or multiple time conditions may be used as checkpoints without resetting the same.

After the method 200 has reached the first checkpoint T2, for example, the simulation continues using the simulation thread S3 until it reaches the next checkpoint T3. At checkpoint T3, the method 200 repeats steps 218, 220, 222 for the four designated simulation threads (S5, S6, S7, S8), and selects the best simulation thread (Sb) in step 224, which is simulation thread S7. The simulation continues using the simulation thread S7 until it reaches the next checkpoint T4. At checkpoint T4, the method 200 repeats steps 218, 220, 222 for the four designated simulation threads (S9, S10, S18, S12), and selects the best simulation thread (Sb) in step 224, which is simulation thread S12. The simulation continues using simulation thread S12 until it reaches the end 302 of the simulation because there are no more checkpoints to satisfy. Without the ability to simultaneously run a multi-thread simulation and evaluate different threads at each checkpoint, the simulation would have continued along a hypothetical base thread 306, ending with a very different result at the end 304 of a hypothetical simulation. The need for restart points is therefore, eliminated by the method 200.

A designated simulation thread may be the same at each checkpoint, depending on whether only one logic condition is used as a checkpoint. In the simulation 300, for example, if only one logic condition is used as a checkpoint, the first simulation thread (S1, S5, S9) at each respective checkpoint (T2, T3, T4) may be the same. Nevertheless, the best simulation thread among the designated number of simulation threads may be different at each checkpoint because the results of each multi-thread simulation run at each checkpoint, which are based on one or more simulation conditions, may be evaluated with different additional subjective parameters. Conversely, the first simulation thread (S1, S5, S9) at each respective checkpoint (T2, T3, T4) may be different if more than one logic condition is used as checkpoints. Similarly, a designated objective parameter may be the same at each checkpoint if only one logic condition is used as a checkpoint. Conversely, a designated objective parameter may be different at each checkpoint if multiple logic conditions are used as checkpoints.

While the present invention has been described in connection with presently preferred embodiments, it will be understood by those skilled in the art that it is not intended to limit the invention to those embodiments. The present invention, for example, is not limited to the oil and gas industry and can generally be applied in many fields for modeling where it is advantageous to evaluate multi-thread runs during a simulation run. It is therefore, contemplated that various alternative embodiments and modifications may be made to the disclosed embodiments without departing from the spirit and scope of the invention defined by the appended claims and equivalents thereof.

The invention claimed is:

1. A computer implemented method for evaluating multiple simulation threads during a simulation run, comprising:
   setting a simulation checkpoint;
   designating a number of multiple simulation threads;
   designating a subjective parameter and an objective parameter;
   designating a time to run a multi-thread simulation;
   starting the simulation run using a computer processor;
   designating an additional subjective parameter based on one or more simulation conditions during the simulation run;
   running the multi-thread simulation for the number of multiple simulation threads at the simulation checkpoint using the subjective parameter, the additional subjective parameter-and the time; and
   evaluating a result for the multi-thread simulation using the objective parameter.

2. The method of claim 1, further comprising:
   selecting a best simulation thread from the number of multiple simulation threads at the simulation checkpoint based on the results for the multi-thread simulation; and
   continuing the simulation run based on the best simulation thread or terminating the simulation run.

3. The method of claim 1, wherein the multi-thread simulation is run simultaneously for the number of multiple simulation threads at the simulation checkpoint.

4. The method of claim 1, further comprising:
   setting another simulation checkpoint;
   designating another additional subjective parameter based on the one or more simulation conditions or based on one or more new simulation conditions;
   running the multi-thread simulation for the number of multiple simulation threads at the another simulation checkpoint using the subjective parameter, the another additional subjective parameter and the time; and
   evaluating a result for the multi-thread simulation using the objective parameter.

5. The method of claim 4, wherein the simulation checkpoint represents a time condition or a logic condition and the another simulation checkpoint represents a time condition or logic condition.

6. The method of claim 4, wherein each of the number of multiple simulation threads used for running the multi-thread simulation at the simulation checkpoint is different than each of the number of multiple simulation threads used for running the multi-thread simulation at the another simulation checkpoint.

7. The method of claim 1, wherein each of the number of multiple simulation threads is different.

8. The method of claim 1, further comprising:
   resetting the simulation checkpoint;
   designating another additional subjective parameter based on the one or more simulation conditions or based on one or more new simulation conditions;
   running the multi-thread simulation for the number of multiple simulation threads at the simulation checkpoint after it is reset using the subjective parameter, the another additional subjective parameter and the time; and
   evaluating a result for the multi-thread simulation using the objective parameter.

9. The method of claim 8, wherein each of the number of multiple simulation threads used for running the multi-thread simulation at the simulation checkpoint is the same as each of the number of multiple simulation threads used for running the multi-thread simulation at the reset simulation checkpoint.

10. A non-transitory program carrier device tangibly carrying computer executable instructions for evaluating multiple simulation threads during a simulation run, the instructions being executable to implement:
    setting a simulation checkpoint;
    designating a number of multiple simulation threads;
    designating a subjective parameter and an objective parameter;
    designating a time to run a multi-thread simulation;
    starting the simulation run;
    designating an additional subjective parameter based on one or more simulation conditions during the simulation run;
    running the multi-thread simulation for the multiple simulation threads at the simulation check point using the subjective parameter, the additional subjective parameter and the time; and
    evaluating a result for the multi-thread simulation using the objective parameter.

11. The program carrier device of claim 10, further comprising:
    selecting a best simulation thread from the number of multiple simulation threads at the simulation checkpoint based on the results for the multi-thread simulation; and
    continuing the simulation run based on the best simulation thread or terminating the simulation run.

12. The program carrier device of claim 10, wherein the multi-thread simulation is run simultaneously for the number of multiple simulation threads at the simulation checkpoint.

13. The program carrier device of claim 10, further comprising:
    setting another simulation checkpoint;
    designating another additional subjective parameter based on the one or more simulation conditions or based on one or more new simulation conditions;
    running the multi-thread simulation for the number of multiple simulation threads at the another simulation checkpoint using the subjective parameter, the another additional subjective parameter and the time; and
    evaluating a result for the multi-thread simulation using the objective parameter.

14. The program carrier device of claim 13, wherein the simulation checkpoint represents a time condition or a logic condition and the another simulation checkpoint represents a time condition or logic condition.

15. The program carrier device of claim 13, wherein each of the number of multiple simulation threads used for running the multi-thread simulation at the simulation checkpoint is different than each of the number of multiple simulation threads used for running the multi-thread simulation at the another simulation checkpoint.

16. The program carrier device of claim 10, wherein each of the number of multiple simulation threads is different.

17. The program carrier device of claim 10, further comprising:
    resetting the simulation checkpoint;
    designating another additional subjective parameter based on the one or more simulation conditions or based on one or more new simulation conditions;
    running the multi-thread simulation for the number of multiple simulation threads at the simulation checkpoint after it is reset using the subjective parameter, the another additional subjective parameter and the time; and evaluating a result for the multi-thread simulation using the objective parameter.

18. The program carrier device of claim 17, wherein each of the number of multiple simulation threads used for running the multi-thread simulation at the simulation checkpoint is the same as each of the number of multiple simulation threads used for running the multi-thread simulation at the reset simulation checkpoint.

* * * * *